(12) United States Patent
Yamaji et al.

(10) Patent No.: US 7,144,781 B2
(45) Date of Patent: Dec. 5, 2006

(54) MANUFACTURING METHOD OF A SEMICONDUCTOR DEVICE

(75) Inventors: Masaharu Yamaji, Nagano (JP); Akio Kitamura, Nagano (JP); Naoto Fujishima, Nagano (JP)

(73) Assignee: Fuji Electric Device Technology Co., Ltd., Tokyo (JP)

( * ) Notice: Subject to any disclaimer, the term of this patent is extended or adjusted under 35 U.S.C. 154(b) by 80 days.

(21) Appl. No.: 10/867,225

(22) Filed: Jun. 15, 2004

(65) Prior Publication Data

US 2005/0020040 A1    Jan. 27, 2005

(30) Foreign Application Priority Data

Jun. 23, 2003    (JP) .............................. 2003-178384

(51) Int. Cl.
*H01L 21/336* (2006.01)
(52) U.S. Cl. ...................... 438/286; 438/302; 438/524
(58) Field of Classification Search ................ 438/286, 438/302, 524
See application file for complete search history.

(56) References Cited

U.S. PATENT DOCUMENTS

| | | | | |
|---|---|---|---|---|
| 5,844,275 A | * | 12/1998 | Kitamura et al. | ........... 257/335 |
| 6,177,704 B1 | * | 1/2001 | Suzuki et al. | ............... 257/343 |
| 2002/0197782 A1 | | 12/2002 | Kitamura | |

* cited by examiner

*Primary Examiner*—Chandra Chaudhari
(74) *Attorney, Agent, or Firm*—Rabin & Berdo, P.C.

(57) ABSTRACT

A plurality of trenches, about 1 μm long in the Z-direction that crosses the X-direction (source-drain direction), are formed in a semiconductor substrate, arranged in the Z-direction. Ion implantation is performed obliquely with respect to side faces of each trench that cross the X-direction. Then, ion implantation is performed perpendicularly to the bottom face of each trench. Then, oxidation and drive-in are performed, whereby semiconductor portions between adjacent trenches are oxidized and each trench is thereby filled with an oxide to establish a wide trench region as would be obtained by connecting the trenches. At the same time, the impurity ions implanted around the trenches are diffused also in the Z-direction, whereby a uniform offset drain region is formed around the trench so that an optimum concentration and diffusion of the impurity ions is obtained, and an oxide or the like is buried in a wide trench region.

21 Claims, 11 Drawing Sheets

MANUFACTURING METHOD OF A SEMICONDUCTOR DEVICE

BACKGROUND OF THE INVENTION

1. Field of the Invention

The invention relates to a method of manufacturing a semiconductor device such as a lateral, high-breakdown-voltage trench MOSFET that is used in power ICs, etc. In particular, the invention relates to a method of manufacturing a semiconductor device that provides an optimum method of impurity diffusion and an optimum method for burying an oxide in a trench region in a process of forming an offset drain region around the trench region.

2. Description of the Prior Art

Conventionally, various trench techniques have been studied as, for example, capacitor formation techniques in DRAMs, etc. and SOI techniques for device isolation as well as trench gate techniques for discrete MOSFETs. In recent years, proposals have been made in which trench techniques are applied to lateral, high-breakdown-voltage, trench MOSFETs that are used in power ICs, etc.

Among the structures of lateral, high-breakdown-voltage, trench MOSFETs is a structure in which an offset drain region is formed around a trench. The formation of an offset drain region around a trench requires a technique of implanting impurity ions around the trench at an optimum concentration and a technique of burying an insulating film such as an oxide film in a wide trench.

The present inventors filed patent applications relating to a technique of implanting impurity ions around a trench and a technique of burying an oxide in a wide trench, e.g., the Japanese patent application JP-A-2003-37267.

However, for the ion implantation technique for formation of an offset drain region around a trench and the technique of burying an insulating film in a wide trench, there are substantially no effective proposals or reports except the proposals of the inventors. Even the method that is disclosed in JP-A-2003-37267 has room for further improvement.

OBJECT AND SUMMARY OF THE INVENTION

The invention has been made in view of the above circumstances, and an object of the invention is therefore to provide a method of manufacturing a semiconductor device, including a method for implanting impurity ions into a region around a trench at an optimum concentration and diffusing the impurity ions, and a method for burying an oxide or the like in a wide trench region to obtain a lateral, high-breakdown-voltage, trench MOSFET having an offset drain region around a trench.

To attain the above object, the invention provides a method of manufacturing a semiconductor device for manufacturing a semiconductor device having a source region of a second conductivity type and a drain region of the second conductivity type that are surface layers of a semiconductor substrate of a first conductivity type and are parallel with each other, and a drain drift region of the second conductivity type that is located between the source region and the drain region and separated from the source region. The method includes forming a plurality of trenches in the semiconductor substrate in such a manner that they are arranged in a first direction in which the source region and the drain region extend in parallel. Each of the trenches formed by this method has a length in the first direction shorter than a length in a second direction that traverses the source region and the drain region. Impurity ions are implanted only into regions of the semiconductor substrate that are adjacent to side faces that are parallel with the first direction among side faces of each of the trenches This is performed by applying the impurity ions in directions that are oblique with respect to the respective side faces being parallel with the first direction, and in planes that are parallel with the second direction. Impurity ions are implanted into a region of the semiconductor substrate that is adjacent to a bottom face of each of the trenches by applying the impurity ions perpendicularly to the bottom face.

In this aspect of the invention, the trenches may be formed perpendicularly to a surface of the semiconductor substrate. Oblique ion implantation may be performed at an ion implantation angle with respect to the side faces that are parallel with the first direction. The ion implantation angle is smaller than or equal to 60° and is equal to $\tan^{-1}[(\text{the length of the trenches in the second direction})/\{(\text{a depth of the trenches})+(\text{a thickness of an ion implantation mask})\}]$. The manufacturing method may further comprise the step of diffusing the impurity ions implanted in the semiconductor substrate in the first direction by heating the semiconductor substrate, and thereby forming a uniform, integral impurity diffusion region that coextends with a region of all the trenches. Alternatively, the manufacturing method may further comprise the step of diffusing the impurity ions implanted in the semiconductor substrate by heating the semiconductor substrate, and thereby forming independent impurity diffusion regions that correspond to the respective trenches.

According to this aspect of the invention, a wide, uniform drain drift region can be formed in the semiconductor substrate or a plurality of drain drift regions can be formed at intervals so as to occupy a wide region of the semiconductor substrate. The impurity concentration of the regions adjacent to the side faces of each trench and that of the region adjacent to the bottom face of each trench, can be controlled independently of each other.

To attain the above object, the invention also provides a method of manufacturing a semiconductor device having a source region of a second conductivity type and a drain region of the second conductivity type, that are surface layers of a semiconductor substrate of a first conductivity type, and a drain drift region of the second conductivity type that is located between the source region and the drain region and separated from the source region This method includes forming a plurality of trenches in the semiconductor substrate in such a manner that they are arranged in a first direction in which the source region and the drain region extend in parallel. Each of the trenches is formed so that a length in the first direction is shorter than a length in a second direction that traverses the source region and the drain region. The method also includes heating the semiconductor substrate to oxidize each semiconductor portion between adjacent ones of the trenches and thereby fill each of the trenches with an oxide.

According to this aspect of the invention, the semiconductor portions between the trenches are oxidized and thereby connected to each other. Therefore, a wide region that is filled with an oxide can be formed in the semiconductor substrate.

The invention also provides a method for manufacturing a semiconductor device having a source region of a second conductivity type and a drain region of the second conductivity type that are surface layers of a semiconductor substrate of a first conductivity type, and a drain drift region of the second conductivity type that is located between the source region and the drain region and separated from the source region, The method includes forming a plurality of trenches in the semiconductor substrate in such a manner that they are arranged in a first direction in which the source region and the drain region extend in parallel. Each of the trenches is formed so that a length in the first direction is shorter than a length in a second direction that traverses the source region and the drain region. The semiconductor substrate is heated to form oxide layers parallel with the side faces and a bottom face of each of the trenches so as to leave a gap that occupies a central portion of each of the trenches. The gap then is filled by depositing an oxide in it.

According to this aspect of the invention, the semiconductor portions between the trenches are oxidized and expand into the trenches. And the remaining gaps are filled with a deposited oxide. Therefore, a wide region that is filled with an oxide can be formed in the semiconductor substrate.

In the invention, plural sets of trenches arranged in the first direction may be arranged in the second direction to form a plurality of trench arrays. This makes it possible to bury an oxide in a wide trench region that is also long in the source-drain direction.

DETAILED DESCRIPTION OF THE PREFERRED EMBODIMENTS

Methods of manufacturing a semiconductor device according to embodiments of the invention will be hereinafter described in detail with reference to the drawings.

Embodiment 1

Figure 1:
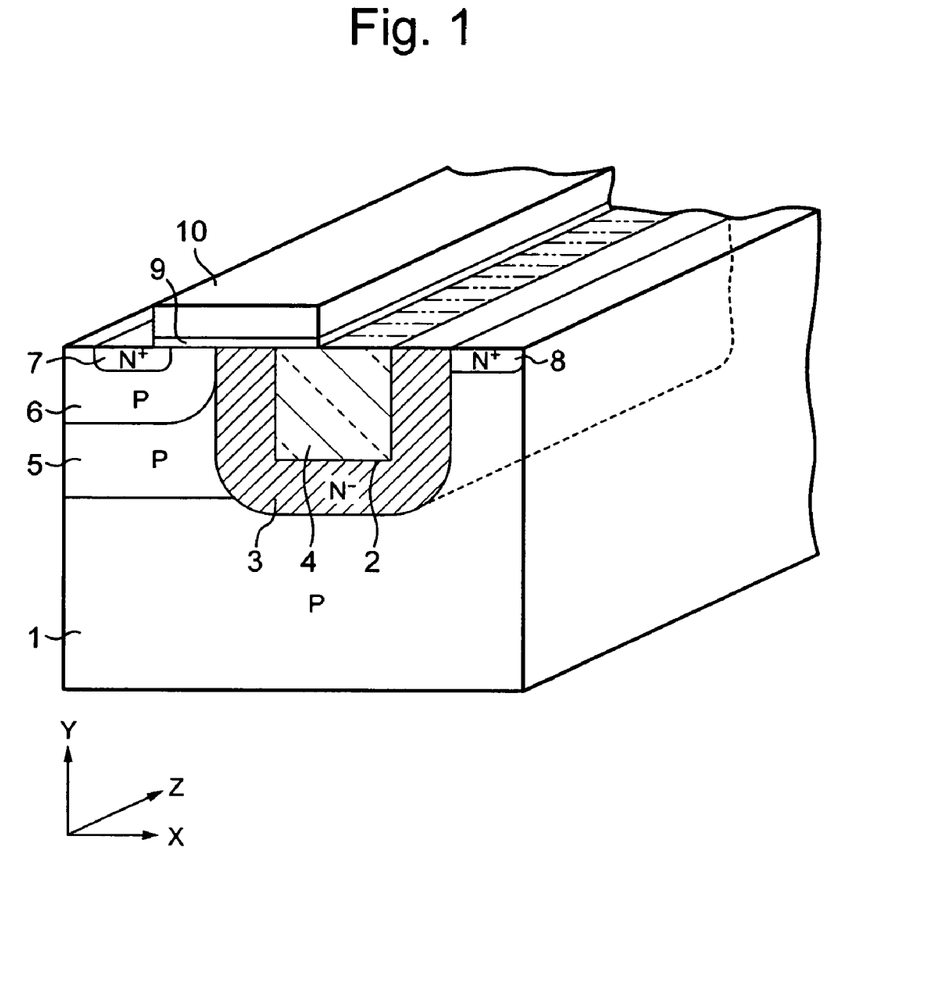
FIG. 1 is a partially sectional perspective view of an exemplary semiconductor device manufactured by a method according to the invention.

FIG. 1 is a partially sectional perspective view showing the structure of an exemplary lateral trench MOSFET that is manufactured by a method of manufacturing a semiconductor device according to the invention. As shown in FIG. 1, the lateral trench MOSFET has a p-type semiconductor substrate 1, a trench region 2, an $N^-$ offset drain region 3, an oxide 4 that fills in the trench region 2, a P-well region 5, a P-type base region 6, an $N^+$ source region 7, an $N^+$ drain region 8, a gate oxide film 9, and a gate electrode 10.

The trench region 2 occupies a surface portion (including a surface) of the semiconductor substrate 1 and is filled with the oxide 4. The $N^-$ offset drain region 3 is formed around the trench region 2 so as to surround the side faces and the bottom face of the trench region 2. The P-well region 5 is formed in a surface portion on the source side of the trench region 2 so as to be adjacent to the outside of $N^-$ offset drain region 3.

The P-type base region 6 is formed in a surface portion of the P-well region 5. The $N^+$ source region 7 is formed in a surface portion of the P-type base region 6 so as to be separated from the $N^-$ offset drain region 3. The $N^+$ drain region 8 is formed in a surface portion of the semiconductor substrate 1 on the drain side of the trench region 2 (i.e., on the side opposite to the source side). The gate oxide film 9 is formed on the surfaces of the $N^+$ source region 7 to a source-side portion $N^-$ offset drain region 3. The gate electrode 10 is extended to the top of the trench region 2 and formed on the gate oxide film 9.

Although omitted in FIG. 1, an interlayer insulating film, a source electrode, a drain electrode, and a passivation film also are formed. The interlayer insulating film covers the gate electrode 10 and the trench region 2. The source electrode is electrically connected to the P-type base region 6 and the $N^+$ source region 7. The drain electrode is electrically connected to the $N^+$ drain region 8. The passivation film covers the entire semiconductor device.

Next, a process of manufacturing the lateral trench MOSFET having the structure of FIG. 1 will be described. For the sake of convenience of description, as shown in FIG. 1, the direction (first direction) parallel with the $N^+$ source region 7 and the $N^+$ drain region 8 is referred to as a Z-direction, the direction (second direction) traversing the $N^+$ source region 7 and the $N^+$ drain region 8 is referred to as an X-direction, and the depth direction of the substrate 1 is referred to as a Y-direction.

FIGS. 2(a)–2(l) are for description of the manufacturing process and are vertical sectional views showing, in order, structures obtained during manufacture of a semiconductor device. First, a P-type semiconductor substrate 1 is prepared (see FIG. 2(a)) and an oxide film 21 of 1 μm, for example, in thickness is formed on the surface of the semiconductor substrate 1 by oxidizing it (see FIG. 2(b)). Then, a resist 22 is applied to the oxide film 21 (see FIG. 2(c)). Then, a portion of the resist 22, under which a trench region 2 is to be formed, is removed in slit form by performing exposure and development (see FIG. 2(d)).

Figure 2A:
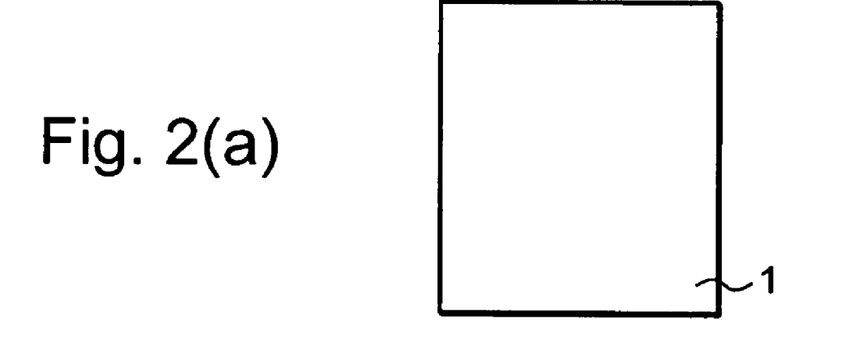
FIGS. 2(a)–2(l) are vertical sectional views showing successive stages of structure during the manufacture of a semiconductor device, according to a first embodiment of the method of the invention.
Figure 2B:
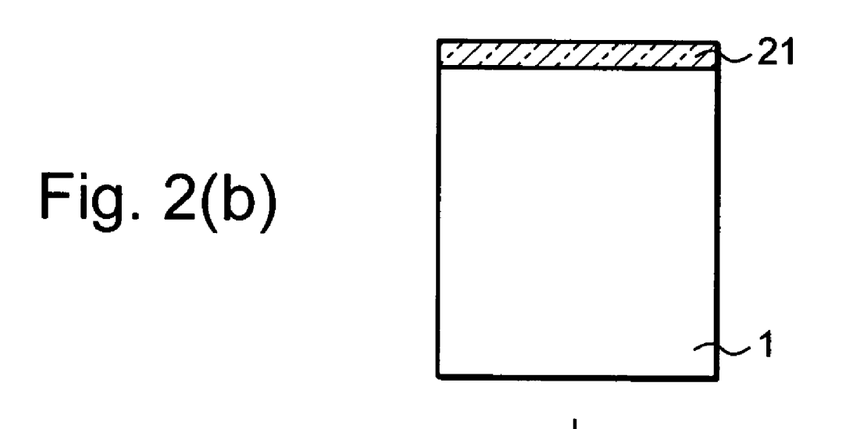
Figure 2C:
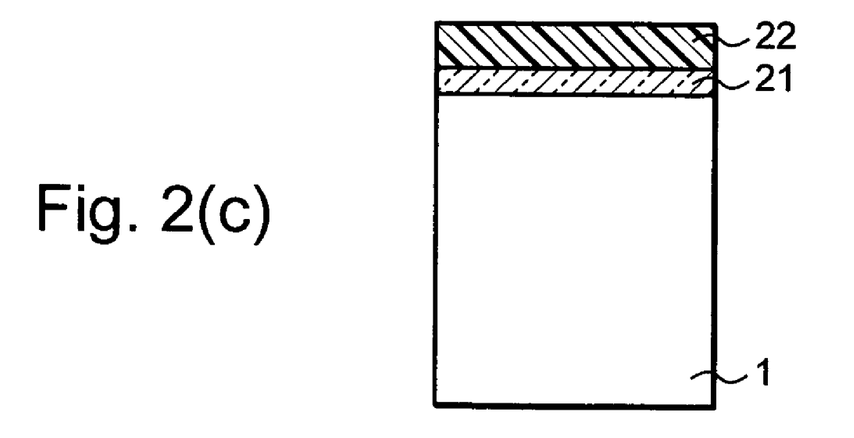
Figure 2D:
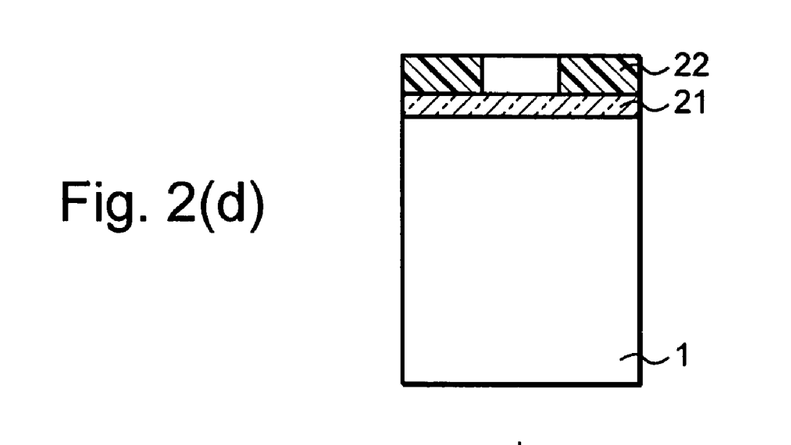
Figure 2E:
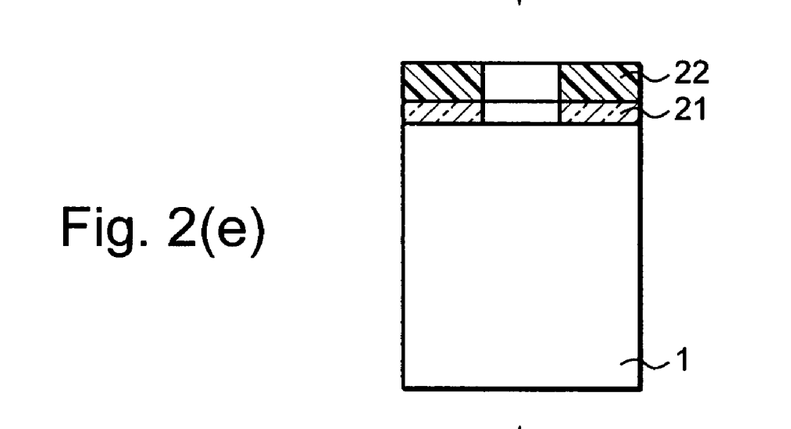
Figure 2F:
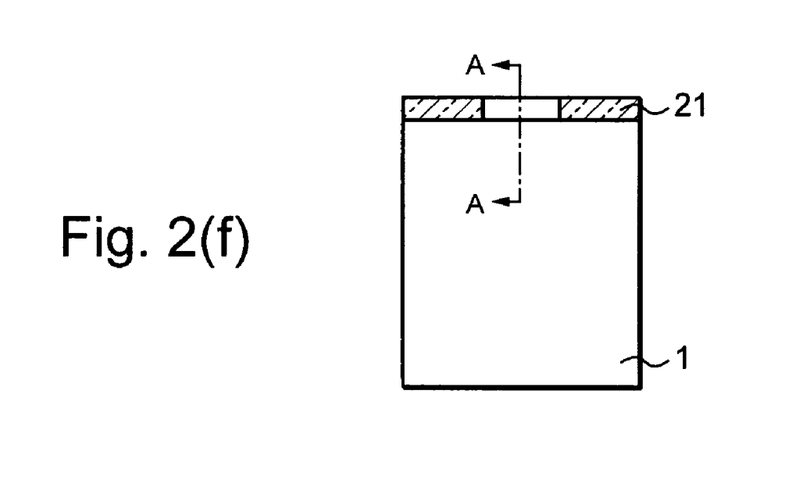
Figure 3:
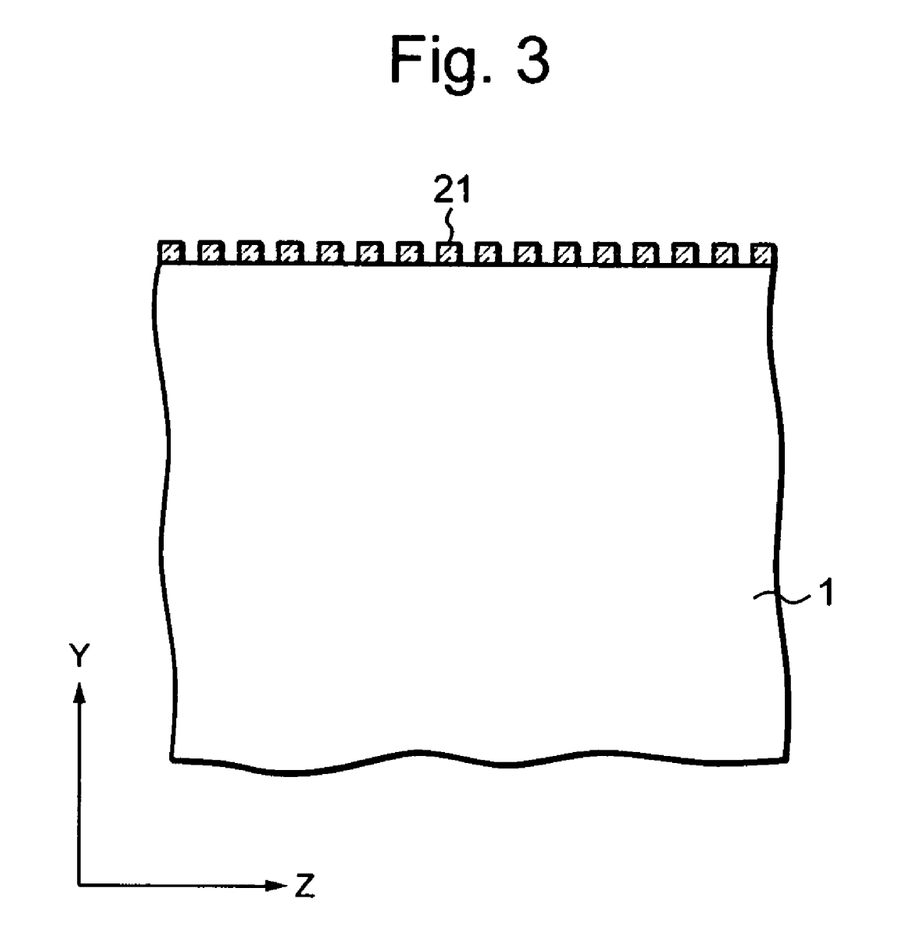
FIG. 3 is a sectional view taken along line A—A in FIG. 2(f).

Subsequently, etching is performed by using a residual resist 22 as a mask, whereby a substrate surface, under which the trench region 2 is to be formed, is exposed in slit form (see FIG. 2(e)). Then, the resist 22 is removed by resist ashing (see FIG. 2(f)). FIG. 3 is a sectional view taken along line A—A in FIG. 2(f) showing a substrate surface as viewed in the X-direction that is obtained after the resist ashing.

Figure 2G:
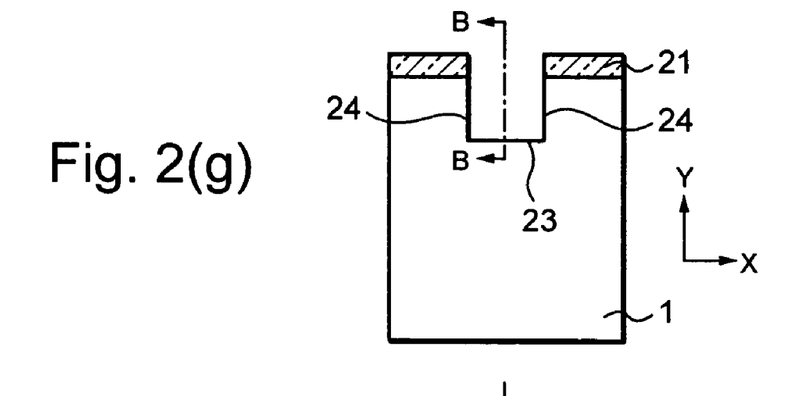

Then, silicon etching is performed by using, as a mask, a residual oxide film 21 remaining on the substrate surface, whereby a plurality of trenches 23 each of which is 20 μm in length (i.e., length in the X-direction), 20 μm in depth (i.e., length in the Y-direction), and 1 μm in width (i.e., length in the Z-direction) are formed in the semiconductor substrate 1 at intervals (in the Z-direction) of 1 μm, for example (see FIG. 2(g)).

Figure 4:
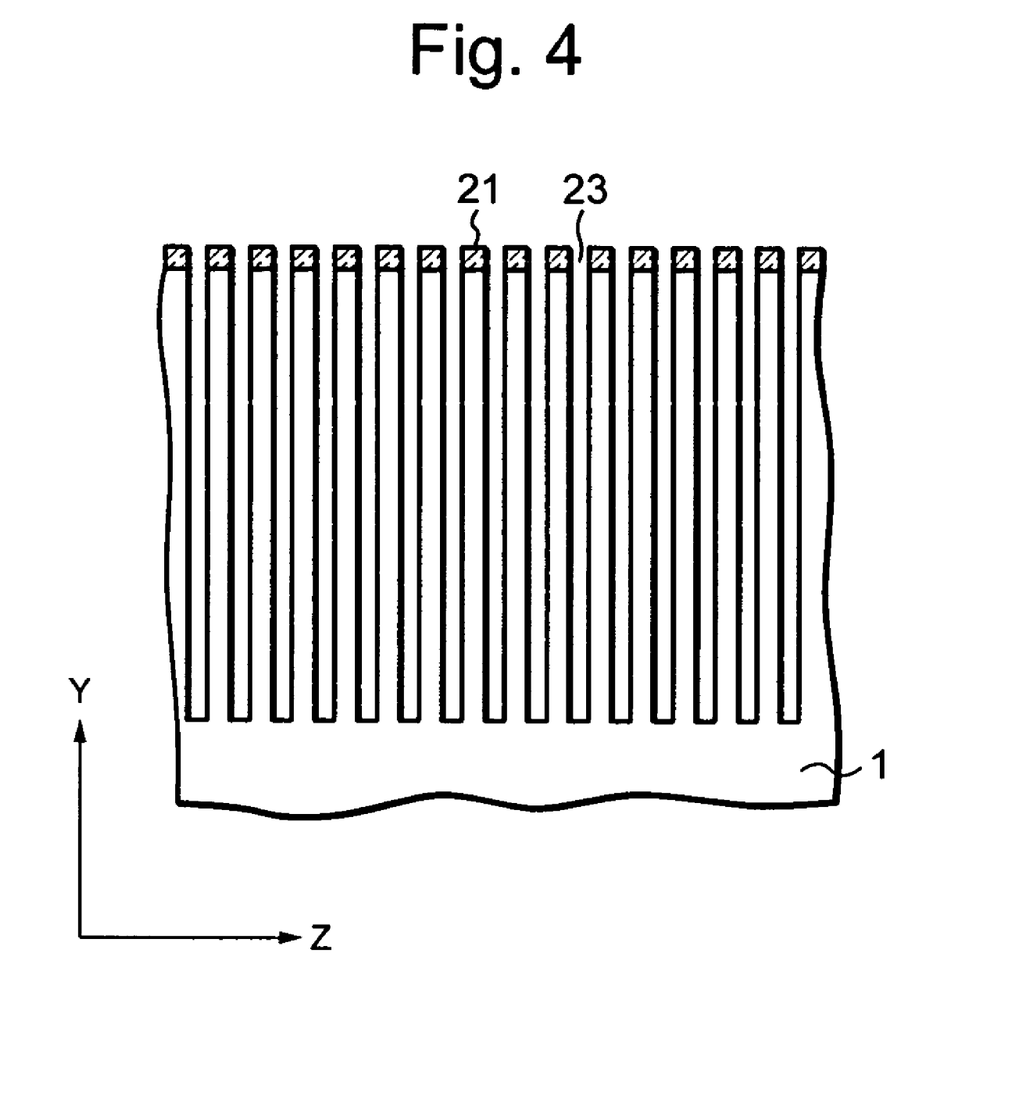
FIG. 4 is a sectional view taken along line B—B in FIG. 2(g).

FIG. 4 is a sectional view taken along line B—B in FIG. 2(g) showing a substrate surface, as viewed in the X-direction, that is obtained after the trench etching. As shown in FIG. 4, the slit-like trenches 23 are arranged in the Z-direction. In FIG. 1, imaginary lines (two-dot chain lines) drawn on the surface of the oxide 4 that fills in the trench region 2 indicate the slit-like trenches 23, which are arranged in the Z-direction.

Figure 2H:
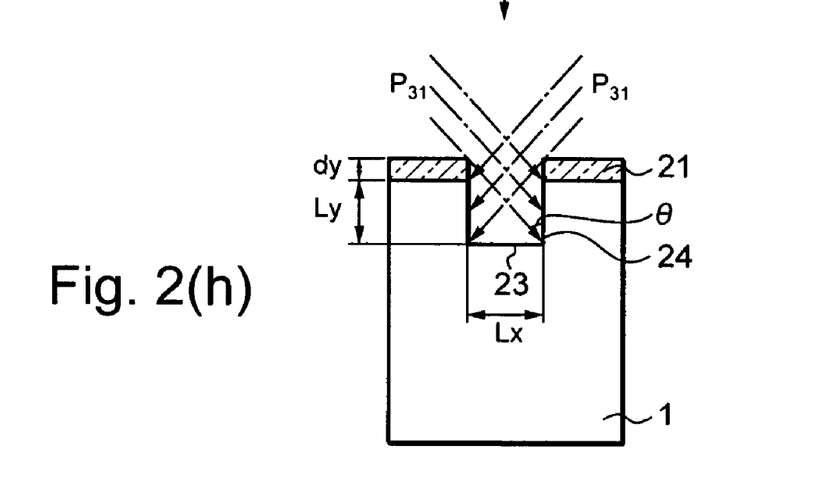

Subsequently, phosphorus ions as an N-type impurity are implanted in directions that are oblique with respect to the side faces 24 of the trenches 23 that are parallel with the Z-direction, that is, crossing the X-direction (see FIG. 2(h)). The ion implantation density is $2.8 \times 10^{12}$ cm$^{-2}$.

The ion implantation angle θ, that is, the angle formed by the ion implantation direction and the side faces 24 of the trenches 23 that cross the X-direction, should be 60° or less and is given by the following equation:

$$\theta = \tan^{-1}\{Lx/(Ly+dy)\}$$

where Lx and Ly are the lengths of the trenches 23 in the X-direction and the Y-direction, respectively, and dy is the thickness of the ion implantation mask.

In this embodiment, as described above, the lengths Lx and Ly of the trenches 23 in the X-direction and the Y-direction, respectively, are both equal to 20 μm. The thickness dy of the ion implantation mask, that is, the oxide film 21, is equal to 1 μm. With these dimensions, the ion implantation angle $\theta = \tan^{-1}\{20 \mu m/(20 \mu m + 1 \mu m)\}$ is equal to about 44°.

Performing ion implantation at this angle makes it possible to implant phosphorus ions into the semiconductor substrate 1 only through the side faces 24 of the trenches 23 that cross the X-direction. This is because when viewed in the ion implantation direction the bottom faces of the trenches 23 are shadowed by the oxide film 21 around the trenches 23 (and hence phosphorus ions do not reach the bottom faces of the trenches 23) and the side faces 24 of the trenches 23 that cross the X-direction are not shadowed by the oxide film 21. Therefore, the angle θ of the oblique ion implantation depends on the lengths Lx and Ly of the trenches 23 in the X-direction and the Y-direction, respectively, and the thickness dy of the oxide film 21.

Figure 2I:
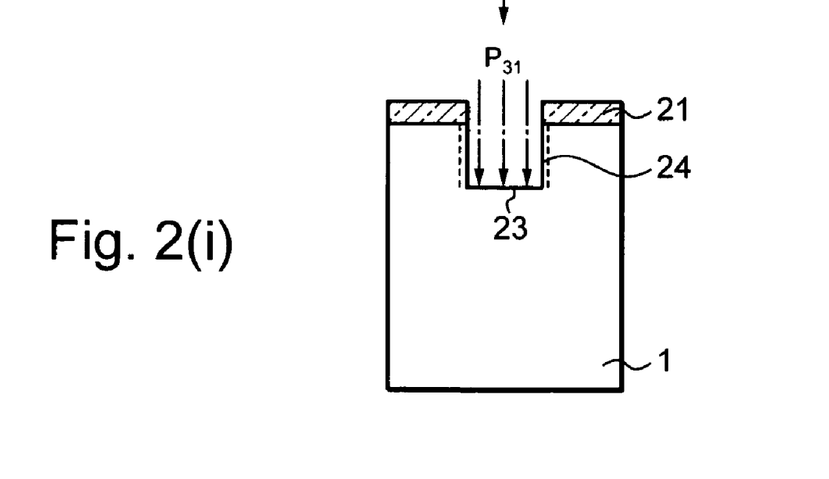
Figure 2J:
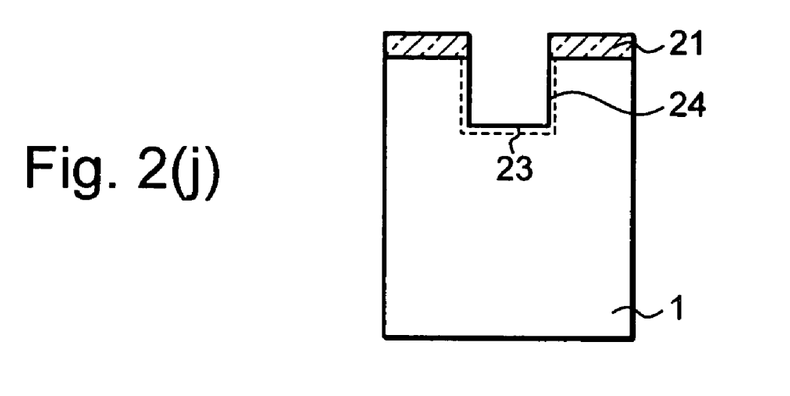

Then, phosphorus ions as an N-type impurity are implanted in the direction perpendicular to the bottom faces of the trenches 23, that is, in the direction that is at 0° with respect to the side faces 24 of the trenches 23 (see FIG. 2(i)). With this 0° ion implantation, phosphorus ions are implanted only through the bottom faces of the trenches 23 (see FIG. 2(j)). In FIGS. 2(i) and 2(j), broken lines along the side faces 24 or the bottom face of the trench 23 indicate implanted impurity ions.

To equalize the surface concentration of phosphorus ions in the portions of the N⁻ offset drain region 3 that are adjacent to the side face of the trench regions 2 with that in the portions adjacent to the bottom face of the trench region 2, the amount of ion implantation through the bottom faces is set $1/\sqrt{2}$ times that through the side faces 24. Therefore, the density ions implanted using 0° ion implantation is $2 \times 10^{12}$ cm$^{-2}$, for example. In the oblique ion implantation that is performed first, no phosphorus ions are implanted into the portions that are adjacent to the bottom faces of the trenches 23 and hence no local regions where the phosphorus ion concentration is high are formed in the portion that is adjacent to the bottom face of the trench region 2.

Figure 2K:
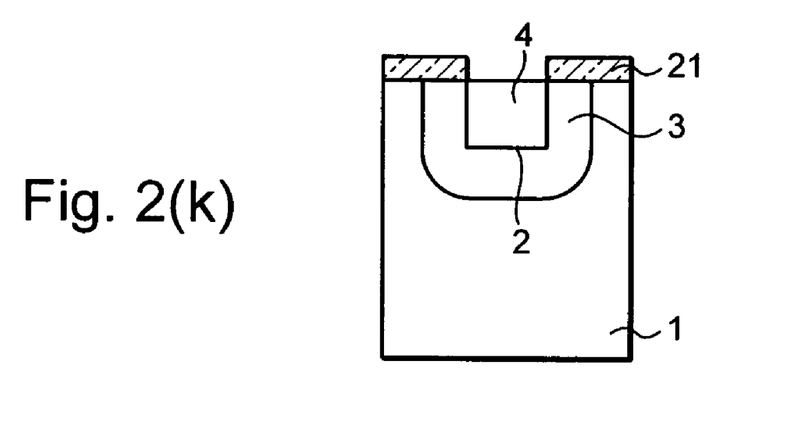

Then, oxidation and drive-in are performed so as to obtain a diffusion depth xj of about 4 μm, for example. At this time, the semiconductor portions between the trenches 23 are oxidized, whereby 2-μm-thick oxide layers are formed. The trenches 23 are filled with the oxide and the semiconductor portions between the trenches 23 become complete oxide layers to establish a state that the trenches 23 are connected to each other and the trench region 2 is filled with the oxide 4.

During the above thermal oxidation, the impurity ions that have been implanted through the side faces 24 of the trenches 23 that cross the X-direction and their bottom faces also are diffused in the Z-direction. As a result, the impurity diffusion regions around the trenches 23 are connected to each other, whereby a uniform N⁻ offset drain region 3 is formed around the trench region 2 (see FIG. 2(k)).

Figure 2L:
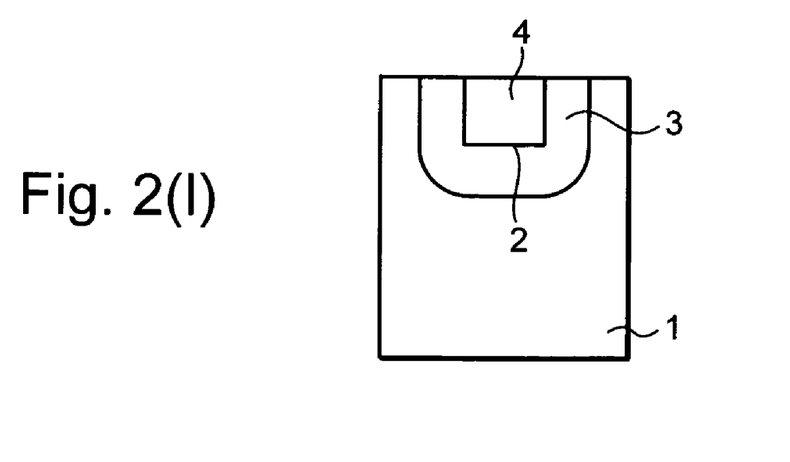

Then, the oxide film 21 on the substrate surface is removed (see FIG. 2(l)) and a P-well region 5, a P-type base region 6, an N⁺ source region 7, an N⁺ drain region 8, a gate oxide film 9, and a gate electrode 10 are formed by known methods. Then, an interlayer insulating film, a source electrode, a drain electrode, and a passivation film are formed, whereby a lateral trench MOSFET having the structure of FIG. 1 is completed.

The above-described first embodiment makes it possible to form a plurality of slit-like trenches 23 so that they are arranged in the width direction of the channel between the source and the drain of the MOSFET, implant impurity ions around the slit-like trenches 23 at an optimum concentration, and diffuse the impurity ions, and to bury the oxide 4 in a wide trench region 2. Therefore, a lateral, high-breakdown-voltage, trench MOSFET having the offset drain region 3 around a wide trench region 2 can be obtained. Further, the impurity concentration of the portions of the offset drain region 3 that are adjacent to the respective side faces of the trench region 2 and that of the portion of the offset drain region 3 that is adjacent to the bottom face of the trench region 2 can be controlled to optimum values by separately implanting ions into those two kinds of portions.

The impurity concentration of the portions of the N⁻ offset drain region 3 that are adjacent to the respective side faces of the trench region 2 may be set either higher or lower than that of the portion of the N⁻ offset drain region 3 that is adjacent to the bottom face of the trench region 2. For example, the impurity concentration of the portions of the N⁻ offset drain region 3 that are adjacent to the respective side faces of the trench region 2 may be set at $2 \times 10^{15}$ cm$^{-3}$ and that of the portion of the N⁻ offset drain region 3 that is adjacent to the bottom face of the trench region 2 may be set at $3 \times 10^{15}$ cm$^{-3}$. A high breakdown voltage of 700 V can be attained even if the impurity concentration is set higher only in the portion of the N⁻ offset drain region 3 that is adjacent to the bottom face of the trench region 2. And the diffusion resistance can be decreased there. That is, the tradeoff between the device breakdown voltage and the on-resistance per unit area can be made more favorable by separately implanting ions through the side faces and the bottom face.

Embodiment 2

Figure 5:
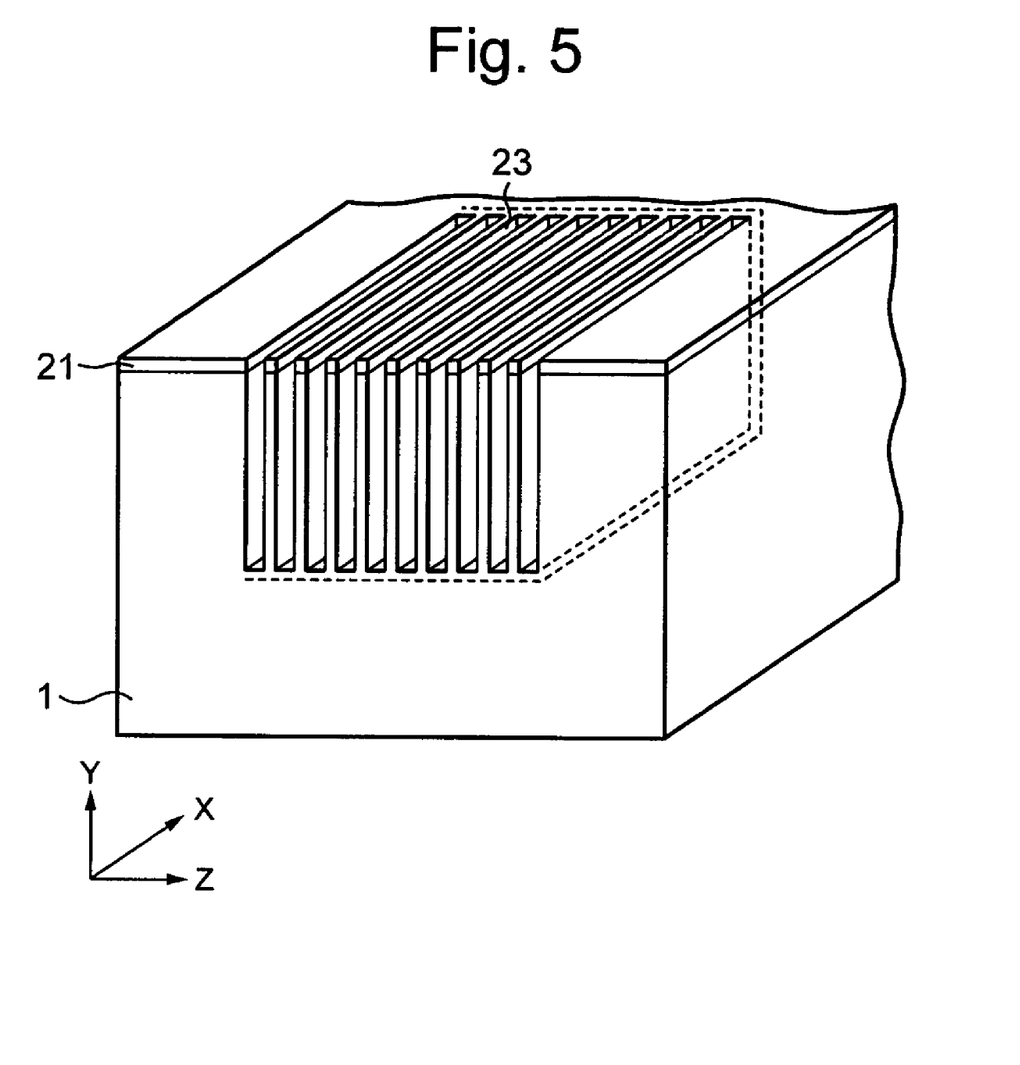
FIG. 5 is a partially sectional perspective view showing an intermediate stage of the structure during manufacture of a semiconductor device, according to a second embodiment of the method of the invention.

A second embodiment is such that the trench region 2 is filled with the oxide 4 by depositing an oxide film after performing ion implantation for formation of the N˟ offset drain region 3, oxidation, and drive-in. FIG. 5 (a partially sectional perspective view), and FIGS. 6(a), 6(b) and 6(c) (vertical sectional views) illustrate a manufacturing process according to the second embodiment. That is FIG. 5, 6(a), 6(b) and 6(c) show structures at successive stages during the manufacture of a semiconductor device according to the second embodiment.

Silicon etching is performed by using a residual oxide film 21 as a mask in the same manner as in the first embodiment, whereby a plurality of trenches 23, each of which is 20 μm in length (i.e., length in the X-direction), 20 μm in depth (i.e., length in the Y-direction), and 3 μm in width (i.e., length in the Z-direction), are formed in the semiconductor substrate 1 at 1 μm intervals (in the Z-direction), for example. Ten trenches 23 are formed in the example of FIG. 5, though there are no limitations on the number of trenches 23.

Then, as in the same manner as in the first embodiment, oblique ion implantation through the side faces of the trenches 23 that cross the X-direction, and ion implantation through the bottom faces of the trenches 23, are performed. FIG. 5 shows a state at this time. In FIG. 5, broken lines parallel with the side faces or the bottom faces of the trench 23 indicate implanted impurity ions.

Figure 6A:
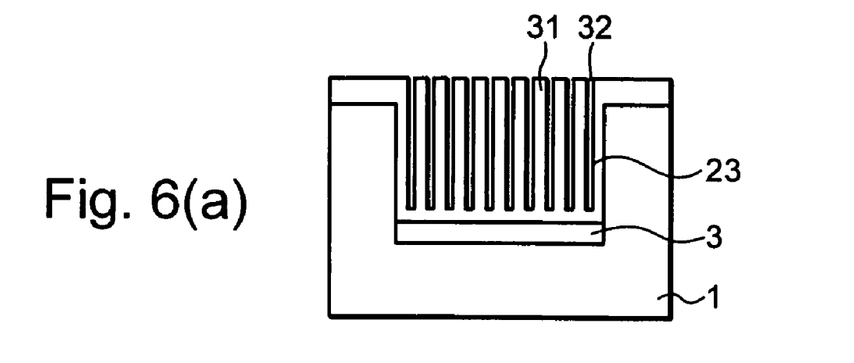
FIGS. 6(a)–6(c) are vertical sectional views showing successive stages of structure during the manufacture of a semiconductor device, according to the second embodiment of the method of the invention.

Then, oxidation and drive-in are performed, whereby a uniform N$^-$ offset drain region 3 is formed around the trench region 2. At this time, the semiconductor portions between the trenches 23 are oxidized, whereby 2-μm-thick oxide layers are formed. The semiconductor portions between the trenches 23 become complete oxide layers 31. However, gaps 32 of about 1 μm remain in the respective trenches 23 so that the trenches 23 are not completely filled with the oxide (see FIG. 6(*a*)).

Figure 6B:
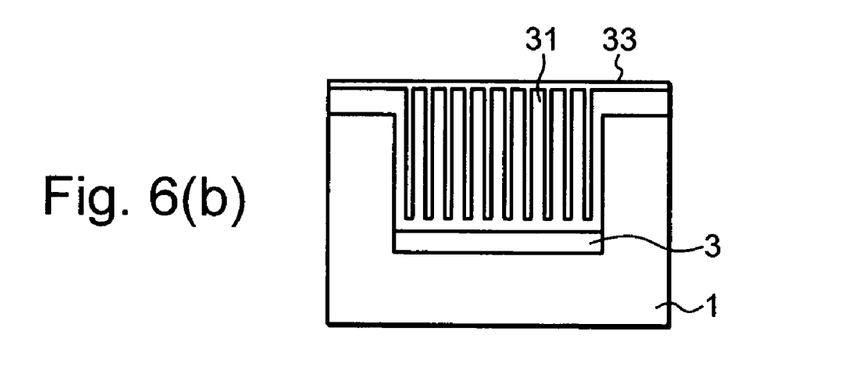
Figure 6C:
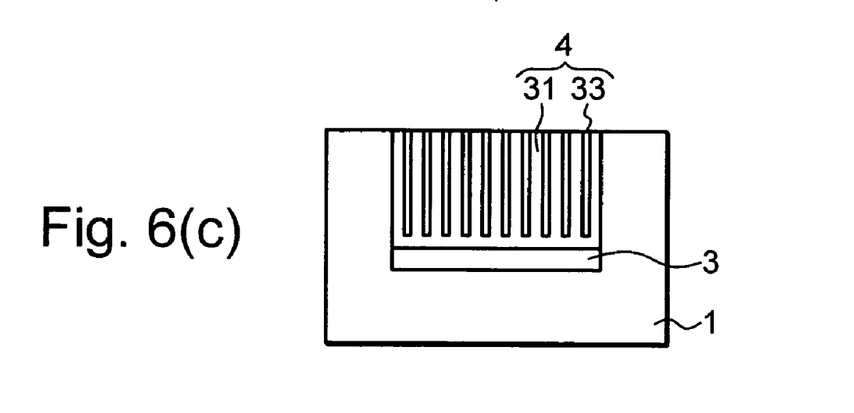

Therefore, the gaps 32 in the respective trenches 23 are filled with an oxide film 33 made of TEOS, HTO, or the like by depositing the oxide film 33 (see FIG. 6(*b*)). Then, the oxide film 33 on the substrate surface is removed by etch-back. As a result, a state is obtained in which the trench region 2 is filled with the oxide 4, that is, the oxide layers 31 formed by the thermal oxidation and the deposited oxide film 33 (see FIG. 6(*c*)).

Then, a P-well region 5, a P-type base region 6, an N$^+$ source region 7, an N$^+$ drain region 8, a gate oxide film 9, and a gate electrode 10 are formed by known methods. Finally, an interlayer insulating film, a source electrode, a drain electrode, and a passivation film are formed, whereby a lateral trench MOSFET having the structure of FIG. 1 is completed.

According to the above second embodiment, since an oxide film 33 is deposited after the thermal oxidation, an even wider trench region 2 can be filled with the oxide 4. Therefore, a lateral, high-breakdown-voltage, trench MOSFET, having the offset drain region 3 around an even wider trench region 2, can be obtained.

Embodiment 3

Figure 7:
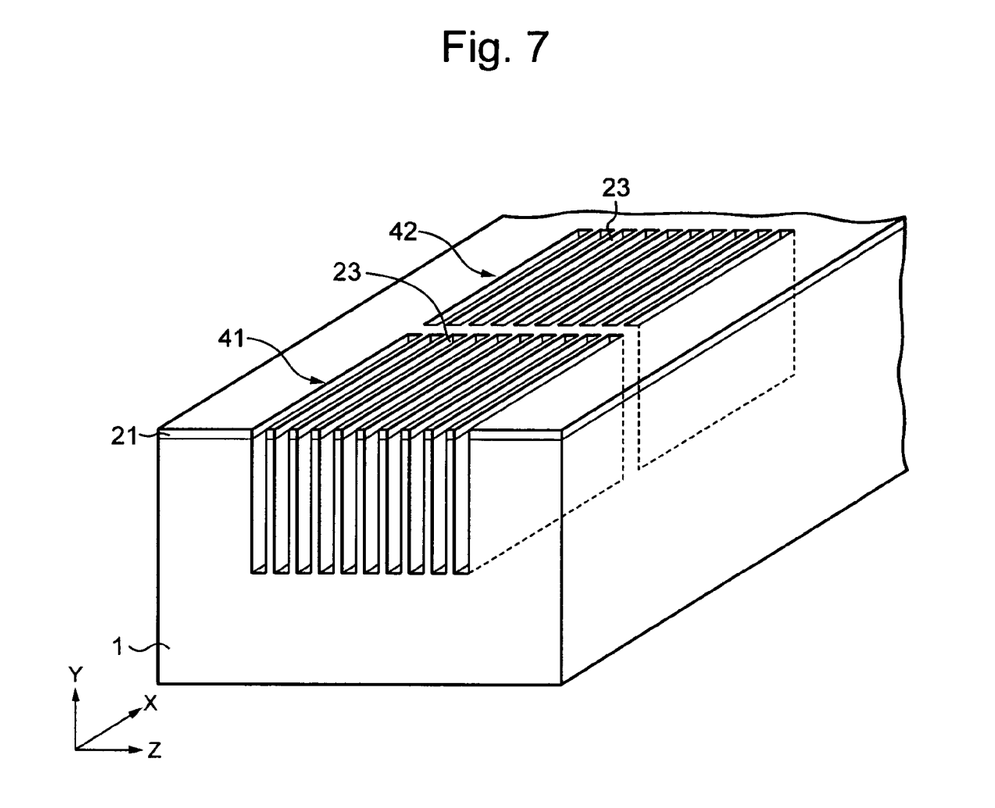
FIG. 7 is a partially sectional perspective view showing a stage of the structure after trench etching during manufacture of a semiconductor device, according to a third embodiment of the method of the invention.
Figure 8:
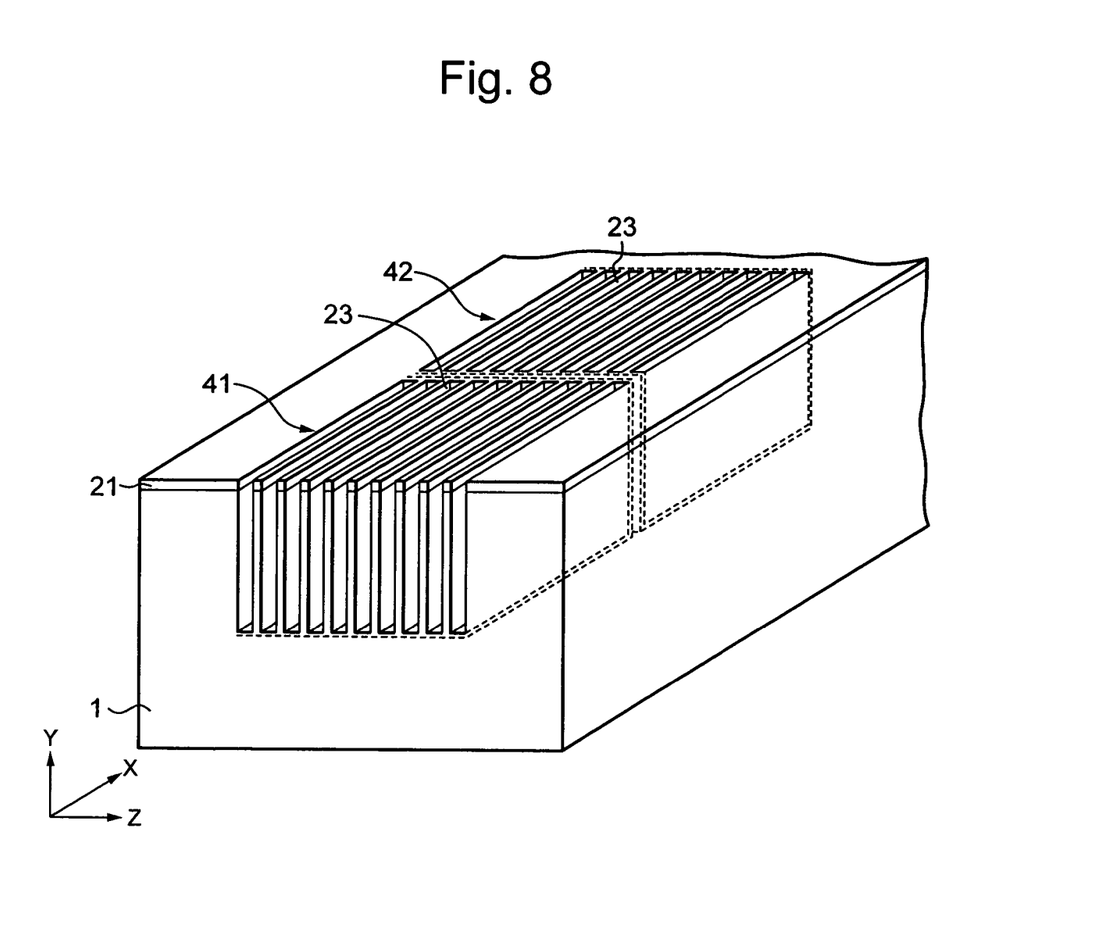
FIG. 8 is a partially sectional perspective view showing a stage of the structure after ion implantation, according to the third embodiment of the method of the invention.

As shown in FIG. 7, in a third embodiment a plurality of trench arrays 41 and 42 each have a plurality of parallel trenches 23 that are long and narrow and extend in the X-direction in a plan view. The trenches of each array are arranged in a row that extends in line in the Z-direction. The two arrays are arranged side—ide in the X-direction. FIGS. 7 and 8 are partially sectional perspective views showing states that are obtained after trench etching and ion implantation, respectively.

In the example of FIG. 7, the two trench arrays 41 and 42, in each of which 10 trenches 23 are arranged in a line in the Z-direction, are formed in the semiconductor substrate 1 so as to be arranged side-by-side in the X-direction (the invention is not limited to this example). The semiconductor portion between the one trench array 41 and the other trench array 42 have such a width (e.g., 1 μm) as to be completely changed to an oxide by thermal oxidation.

The manufacturing process of the third embodiment is the same as that of the first or second embodiment except that an oxide film 21 that is used as a mask in forming trenches 23 has a pattern corresponding to the trench pattern of FIG. 7. Therefore, a description of the manufacturing process would be repetitive, and will not be repeated for the sake of brevity.

According to the third embodiment, since a plurality of trenches 23 are formed not only in the Z-direction but also in the X-direction, a trench region 2 that is even wider in the X-direction can be filled with the oxide 4. Therefore, a lateral, high-breakdown-voltage, trench MOSFET having the offset drain region 3 around an even wider trench region 2 can be obtained. Further, a phenomenon that a long and narrow residual semiconductor portion between trenches 23 that are adjacent to each other in the Z-direction, falls during such processing as ion implantation or oxidation/drive-in that is performed after the trench formation, can be prevented.

The invention is not limited to the above embodiments and various modifications are possible. For example, the above-mentioned numerical values of the dimensions, concentrations, etc. are just examples and the invention is not limited to the cases using those numerical values. A modification is possible in which N$^-$ offset drain regions 3 are formed by ion implantation and oxidation/drive-in so as to be independent of each other and to correspond to the respective trenches 23.

The invention can be applied similarly to a case that the first conductivity type is the N type and the second conductivity type is the P type. The invention can be applied to not only the case of using a P-type substrate but also the case of using an N-type substrate. The application range of the invention is not limited to the lateral, high-breakdown-voltage, trench MOSFET, and the invention can broadly be applied to the step of forming trenches of a semiconductor device having a trench structure such as the IGBT in which impurity regions having different conductivity types are formed in the drain region.

The invention makes it possible to implant impurity ions around trenches at an optimum concentration and diffuse the impurity ions, and to bury an oxide or the like in a wide trench region. Therefore, a lateral, high-breakdown-voltage, trench MOSFET having an offset drain region around a wide trench region can be obtained.

This application relates to applicants' Japanese patent application JP PA 2003-178384, filed Jun. 23, 2003, the entire disclosure of which is incorporated herein by reference.

What is claimed is:

1. A method of manufacturing a semiconductor device having a source region of a second conductivity type and a drain region of the second conductivity type that are surface layers of a semiconductor substrate of a first conductivity type, the drain region and source region extending in parallel in a first direction, and a drain drift region of the second conductivity type located between the source region and the drain region and separated from the source region in a second direction perpendicular to the first direction, the method comprising the steps of:

forming a plurality of trenches in the semiconductor substrate in the first direction in parallel with the source region and the drain region, each of the trenches being such that a length thereof in the first direction is shorter than a length thereof in the second direction that; and through each of the trenches, implanting impurity ions into only first regions and a second region of the semiconductor substrate, the first regions being adjacent to side faces that are parallel with the first direction among side faces of each of the trenches, the second region being adjacent to a bottom face of each of the trenches, including
 implanting the impurity ions into the first regions without implanting into the second region by applying the impurity ions in planes perpendicular to the second direction, in directions that are oblique with respect to the respective side faces parallel with the first direction, and
 implanting impurity ions into the second region by applying the impurity ions perpendicularly to the bottom face.

2. The manufacturing method according to claim 1, wherein plural sets of the trenches, each set arranged in the first direction, are arranged in the second direction to form a plurality of trench arrays.

3. The manufacturing method of a semiconductor device according to claim 1, further comprising the step of diffusing the implanted impurity ions in the first direction by heating the semiconductor substrate, thereby to form a uniform, integral impurity diffusion region that coextends with a region of all the trenches.

4. The manufacturing method according to claim 3, wherein plural sets of the trenches, each set arranged in the first direction, are arranged in the second direction to form a plurality of trench arrays.

5. The manufacturing method of a semiconductor device according to claim 1, further comprising the step of diffusing the impurity ions implanted in the semiconductor substrate by heating the semiconductor substrate, thereby to form independent impurity diffusion regions that correspond to the respective trenches.

6. The manufacturing method according to claim 5, wherein plural sets of the trenches, each set arranged in the first direction, are arranged in the second direction to form a plurality of trench arrays.

7. The manufacturing method of a semiconductor device according to claim 1, further comprising the steps of
 forming the trenches perpendicularly to a surface of the semiconductor substrate; and
 performing oblique ion implantation at an oblique ion implantation angle with respect to the side faces that are parallel with the first direction, the oblique ion implantation angle being smaller than or equal to 60° and is equal to $\theta = \tan^{-1}\{Lx/(Ly+dy)\}$, wherein Lx is the length of the trenches in the second direction, Ly is a depth of the trenches, and dy is a thickness of an ion implantation mask.

8. The manufacturing method according to claim 7, wherein plural sets of the trenches, each set arranged in the first direction, are arranged in the second direction to form a plurality of trench arrays.

9. The manufacturing method of a semiconductor device according to claim 7, further comprising the step of diffusing the impurity ions implanted in the semiconductor substrate in the first direction by heating the semiconductor substrate, thereby to form a uniform, integral impurity diffusion region that coextends with a region of all the trenches.

10. The manufacturing method according to claim 9, wherein plural sets of the trenches, each set arranged in the first direction, are arranged in the second direction to form a plurality of trench arrays.

11. The manufacturing method of a semiconductor device according to claim 7, further comprising the step of diffusing the impurity ions implanted in the semiconductor substrate by heating the semiconductor substrate, thereby to form independent impurity diffusion regions that correspond to the respective trenches.

12. The manufacturing method according to claim 11, wherein plural sets of the trenches, each set arranged in the first direction, are arranged in the second direction to form a plurality of trench arrays.

13. A manufacturing method of a semiconductor device for manufacturing a semiconductor device having a source region of a second conductivity type and a drain region of the second conductivity type that are surface layers of a semiconductor substrate of a first conductivity type, and a drain drift region of the second conductivity type, located between the source region and the drain region and separated from the source region, the method comprising the steps of:
 forming a plurality of trenches in the semiconductor substrate, arranged in a first direction in which the source region and the drain region extend in parallel, each of the trenches being such that a length thereof in the first direction is shorter than a length thereof in a second direction that traverses the source region and the drain region; and
 heating the semiconductor substrate to oxidize portions of the semiconductor substrate between adjacent ones of the trenches thereby to fill each of the trenches with an oxide.

14. The manufacturing method according to claim 13, wherein plural sets of the trenches, each set arranged in the first direction, are arranged in the second direction to form a plurality of trench arrays.

15. A manufacturing method of a semiconductor device for manufacturing a semiconductor device having a source region of a second conductivity type and a drain region of the second conductivity type that are surface layers of a semiconductor substrate of a first conductivity type, and a drain drift region of the second conductivity type located between the source region and the drain region and separated from the source region, the method comprising the steps of:
 forming a plurality of trenches in the semiconductor, arranged in a first direction in which the source region and the drain region extend in parallel, each of the trenches being such that a length thereof in the first direction is shorter than a length thereof in a second direction that traverses the source region and the drain region;
 heating the semiconductor substrate to form oxide layers parallel with the side faces and a bottom face of each of the trenches so as to leave a gap that occupies a central portion of each of the trenches; and
 filling the gap with an oxide by depositing the oxide in the gap.

16. The manufacturing method according to claim 15, wherein plural sets of the trenches, each set arranged in the first direction, are arranged in the second direction to form a plurality of trench arrays.

17. The manufacturing method of a semiconductor device according to claim 1, wherein said plurality of trenches is spanned completely by an interval of length in said first direction less than the length of each trench in said second direction.

18. The manufacturing method of a semiconductor device according to claim 1, wherein the trenches are slit-like and the lengths of trenches in the first direction are 1 μm.

19. The manufacturing method of a semiconductor device according to claim 1, wherein the trenches are slit-like, further comprising the steps of filling the trenches with an oxide and oxidizing portions of the semiconductor substrate between adjacent ones of the trenches, the step of filling and oxidizing including heating the semiconductor substrate.

20. The manufacturing method of a semiconductor device according to claim 15, wherein the lengths of trenches in the first direction are 1 μm.

21. The manufacturing method of a semiconductor device according to claim 1, wherein the trenches are slit-like, further comprising the steps of diffusing the impurity ions implanted in the semiconductor substrate in the first direction by heating the semiconductor substrate, thereby to form a uniform, integral impurity diffusion region that coextends with a region of all the trenches; and filling the trenches with an oxide and oxidizing portions of the semiconductor substrate between adjacent ones of the trenches, the step of filling and oxidizing including heating the semiconductor substrate.

* * * * *